(12) United States Patent
Mockarram-Dorri

(10) Patent No.: US 9,141,240 B2
(45) Date of Patent: Sep. 22, 2015

(54) CAPACITIVE TOUCH SENSOR

(71) Applicant: Nokia Corporation, Espoo (FI)

(72) Inventor: Mohammad Ali Mockarram-Dorri, San Diego, CA (US)

(73) Assignee: Nokia Technologies Oy, Espoo (FI)

( * ) Notice: Subject to any disclaimer, the term of this patent is extended or adjusted under 35 U.S.C. 154(b) by 168 days.

(21) Appl. No.: 13/898,618

(22) Filed: May 21, 2013

(65) Prior Publication Data

US 2014/0347309 A1   Nov. 27, 2014

(51) Int. Cl.
*G06F 3/044* (2006.01)
*G01R 27/26* (2006.01)
*G01D 5/24* (2006.01)

(52) U.S. Cl.
CPC *G06F 3/044* (2013.01); *G01D 5/24* (2013.01); *G01R 27/2605* (2013.01)

(58) Field of Classification Search
CPC ....... G06F 3/044; G06F 3/041; G06F 3/0412; G06F 1/1692; G06F 2203/04101; G06F 2203/04107; H03K 2217/960755; G01R 27/2605; H04M 2250/22; H05K 1/09; H05K 2201/0391; H05K 2201/0979
See application file for complete search history.

(56) References Cited

U.S. PATENT DOCUMENTS

| 6,297,811 | B1 | 10/2001 | Kent et al. ..................... 345/173 |
| 8,274,492 | B2 | 9/2012 | Hotelling et al. ............. 345/173 |
| 2006/0238517 | A1* | 10/2006 | King et al. .................... 345/173 |
| 2008/0062139 | A1 | 3/2008 | Hotelling et al. ............. 345/173 |
| 2009/0183931 | A1 | 7/2009 | Okano et al. ................ 178/18.03 |
| 2009/0295753 | A1* | 12/2009 | King et al. .................... 345/174 |
| 2010/0026656 | A1* | 2/2010 | Hotelling et al. ............. 345/174 |
| 2010/0123681 | A1 | 5/2010 | Wu et al. ...................... 345/174 |
| 2010/0201647 | A1 | 8/2010 | Verweg ......................... 345/174 |
| 2011/0109573 | A1 | 5/2011 | Deslippe et al. ............. 345/173 |
| 2011/0109586 | A1* | 5/2011 | Rip et al. ...................... 345/174 |
| 2011/0109587 | A1* | 5/2011 | Ferencz et al. ................ 345/174 |
| 2011/0113371 | A1* | 5/2011 | Parker et al. .................. 715/810 |
| 2011/0248954 | A1 | 10/2011 | Hamada et al. ............... 345/174 |
| 2012/0032917 | A1* | 2/2012 | Yamaguchi .................... 345/174 |
| 2012/0062469 | A1 | 3/2012 | Guard ........................... 345/173 |
| 2012/0062506 | A1 | 3/2012 | Chae et al. .................... 345/174 |
| 2012/0127118 | A1 | 5/2012 | Nolting et al. ................ 345/174 |
| 2013/0038565 | A1* | 2/2013 | Elloway et al. ............... 345/174 |
| 2013/0162596 | A1 | 6/2013 | Kono et al. .................... 345/174 |
| 2014/0104222 | A1* | 4/2014 | Chang ........................... 345/174 |
| 2014/0166464 | A1* | 6/2014 | Fix et al. ....................... 200/600 |

FOREIGN PATENT DOCUMENTS

| CN | 202677364 U | 1/2013 |
| DE | 3004461 A1 | 8/1981 |
| EP | 2 209 064 A1 | 7/2010 |

(Continued)

OTHER PUBLICATIONS

"Midas Fabricating Custon Capactive Touch Sensors to Prototype Interactive Objects", Valkyrie Savage, et al., UIST, Oct. 7-10, 2012, 9 pgs.

*Primary Examiner* — Gerald Johnson
*Assistant Examiner* — Ivelisse Martinez Quiles
(74) *Attorney, Agent, or Firm* — Harrington & Smith

(57) ABSTRACT

An apparatus including capacitive sensors, where the capacitive sensors are arrange in a first layer and a second layer, and where the first layer is located on top of the second layer; and a cover window on top of the first layer, where the cover window does not comprise electrically conductive material.

19 Claims, 4 Drawing Sheets

(56) References Cited

FOREIGN PATENT DOCUMENTS

| EP | 2363787 | A2 | 9/2011 |
|---|---|---|---|
| JP | 2001-324397 | A | 11/2001 |
| KR | 20110137018 | A | 12/2011 |
| WO | WO-2012/053498 | A1 | 4/2012 |
| WO | WO-2013/013905 | A1 | 1/2013 |

* cited by examiner

CAPACITIVE TOUCH SENSOR

BACKGROUND

1. Technical Field

The exemplary and non-limiting embodiments relate generally to a touch sensor.

2. Brief Description of Prior Developments

Touch sensors, such as comprising capacitive sensors for example, are known. In the past, a touch sensor has been provided on top of an electrical display on a hand-held portable device, such as a smartphone or a tablet computer for example.

SUMMARY

The following summary is merely intended to be exemplary. The summary is not intended to limit the scope of the claims.

In accordance with one aspect, an example embodiment comprises an apparatus including capacitive sensors, where the capacitive sensors are arrange in a first layer and a second layer, and where the first layer is located on top of the second layer; and a cover window on top of the first layer, where the cover window does not comprise electrically conductive material.

In accordance with another aspect, an example embodiment comprises an apparatus including a first layer comprising first capacitive sensors; and a second layer comprising second capacitive sensors. The first layer is located on top of the second layer. The first capacitive sensors are arranged in a substantially ring-shaped pattern. The second capacitive sensors are arranged in a pattern sized to fit under the first layer within an area of an inside perimeter of the substantially ring-shaped pattern of the first capacitive sensors.

In accordance with another aspect, an example method comprises providing a first layer comprising first capacitive sensors arranged in a substantially ring-shaped pattern and first electrical conductors extending from the first capacitive sensors towards outer edges of the first layer; providing a second layer comprising second capacitive sensors and second electrical conductors extending from the second capacitive sensors towards outer edges of the second layer, where the second capacitive sensors are arranged in a pattern having a size about a same size as an inner perimeter of the substantially ring-shaped pattern; and locating the first layer on top of the second layer, where the second electrical conductors are located at least partially under the first capacitive sensors.

BRIEF DESCRIPTION OF THE DRAWINGS

The foregoing aspects and other features are explained in the following description, taken in connection with the accompanying drawings, wherein.

DETAILED DESCRIPTION OF EMBODIMENTS

Figure 1:
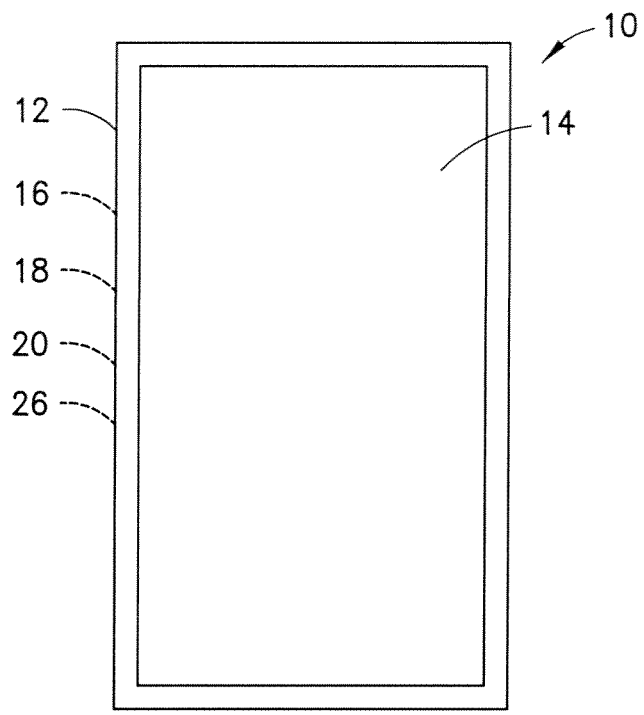
FIG. 1 is a front view of an apparatus comprising features as described herein.

Referring to FIG. 1, there is shown a front view of an apparatus 10 incorporating features of an example embodiment. Although the features will be described with reference to the example embodiments shown in the drawings, it should be understood that features can be embodied in many alternate forms of embodiments. In addition, any suitable size, shape or type of elements or materials could be used.

Figure 2:
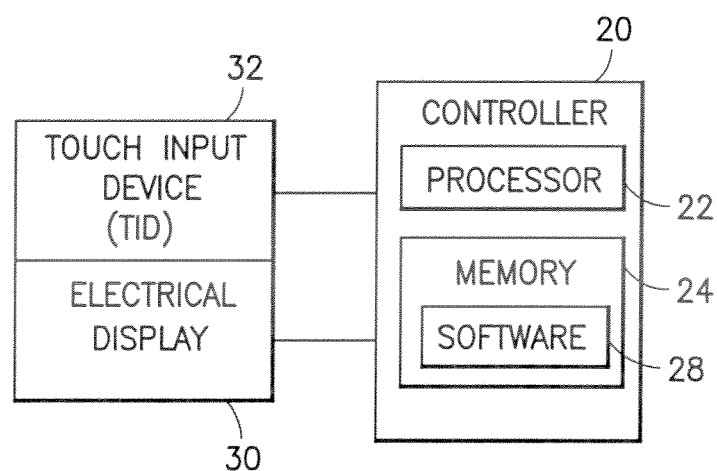
FIG. 2 is a diagram illustrating some of the components of the apparatus shown in FIG. 1.

The apparatus 10 may be a hand-held portable apparatus, such as a communications device which includes a telephone application for example. The apparatus 10 may additionally or alternatively comprise an Internet browser application, camera application, video recorder application, music player and recorder application, email application, navigation application, gaming application, and/or any other suitable electronic device application. Referring to both FIGS. 1 and 2, the apparatus 10, in this example embodiment, comprises a housing 12, a touchscreen 14, a receiver 16, a transmitter 18, a rechargeable battery 26, and a controller 20. However, all of these features are not necessary to implement the features described below. The controller 20 may include at least one processor 22, at least one memory 24, and software 28. The electronic circuitry inside the housing 12 may comprise a printed wiring board (PWB) having components such as the controller 20 thereon. The receiver 16 and transmitter 18 form a primary communications system to allow the apparatus 10 to communicate with a wireless telephone system, such as a mobile telephone base station for example.

The touchscreen 14 in this example is a capacitive touchscreen which functions as both a display screen and as a user input. The user interface may also include a keypad or other user input device. The touchscreen 14 comprises an electrical display 30 and a touch input device (TID) 32. However, in alternate example embodiments the touch input device (TID) 32 might not be part of an electronic display, such as a touch pad for example. The touch input device (TID) 32 is a capacitive touch input device. When a user presses on the touchscreen 14 with a finger (or at least comes close to the touchscreen 14 with the finger), the touch input device (TID) 32 is configured to output a signal to the controller 20 to signal the touch event on the touch input device 32 to the controller 20, such as the location of touch event on the touch input device (TID) 32 for example.

Mobile smartphones and tablet computers commonly have capacitive touch screens, or touch panels. While the designs of the capacitive electrodes of such touch devices vary, and some panels require shields to reduce cross-talk between the panel and the display, all touch panels and touch screens are designed to propagate an electromagnetic field to or beyond the borders of the panel and/or cover window into free space. The algorithms that are implemented in the touch panel integrated circuit (IC) are designed to measure the change in capacitive coupling between a set of electrodes and objects (fingers, hands, etc.) that approach or touch the screen. Typically the capacitive field emanated by the electrodes of the touch panel are non-linear over the entire surface of the screen and, hence, each sensor uses a calibration curve to linearize the output with respect to location of touch. Equally, the magnitude of the projected field varies over time due to drift in the electronics, and hence time variant AC projected fields are used and most measurements are relative. Further, the algorithms contained in the driver chips are also able to compensate for "shadowing", which occurs when extraneous objects come close to the screen and potentially obscure the desired reading. An example of this might be the capacitive image created by the palm of a hand while inputting keystrokes using a thumb.

Hence, capacitive touch screens are sophisticated devices capable of producing a projected field and measuring changes in the field associated with localized changes in the conductivity of the space into which the field propagates. The calibrated output of these sensors is typically provided as a location and number of touch points, represented by spatial coordinates relative to the dimensions of the display. Examples of capacitive touchscreens include 2-D, 2.5-D and 3-D (3-Dimensional) capacitive sensing. A 2-D touch sensor usually involves a simple two layer structure to reference X and Y coordinates on a plane for example. A 3-D touch sensor involves a much more complex structure due to its sensitivity and routing.

Figure 3:
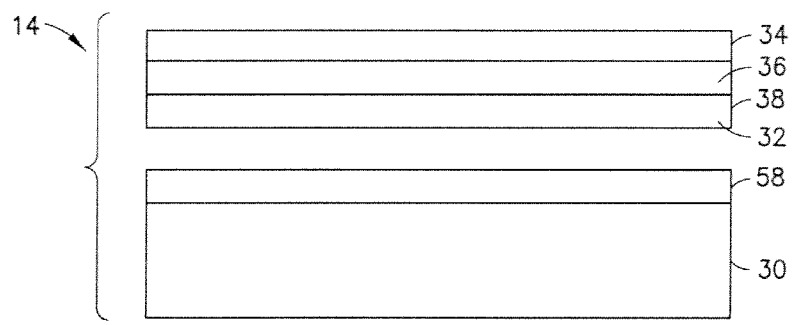
FIG. 3 is a schematic cross sectional view of components of the apparatus shown in FIG. 1.

Referring also to FIG. 3, there is shown a schematic cross sectional view of the touchscreen 14. A cover window 34 is located on top of the touch input device (TID) 32. The touch input device (TID) 32 comprises a first or top layer 36 comprising capacitive sensors or electrodes, and a second or bottom layer 38 comprising capacitive sensors or electrodes. The cover window 34 does not comprise electrically conductive material, such as Indium Thin Oxide (ITO) for example; a substantially invisible conductive material. The cover window 34 may be glass or plastic for example.

Figures 4, 5:
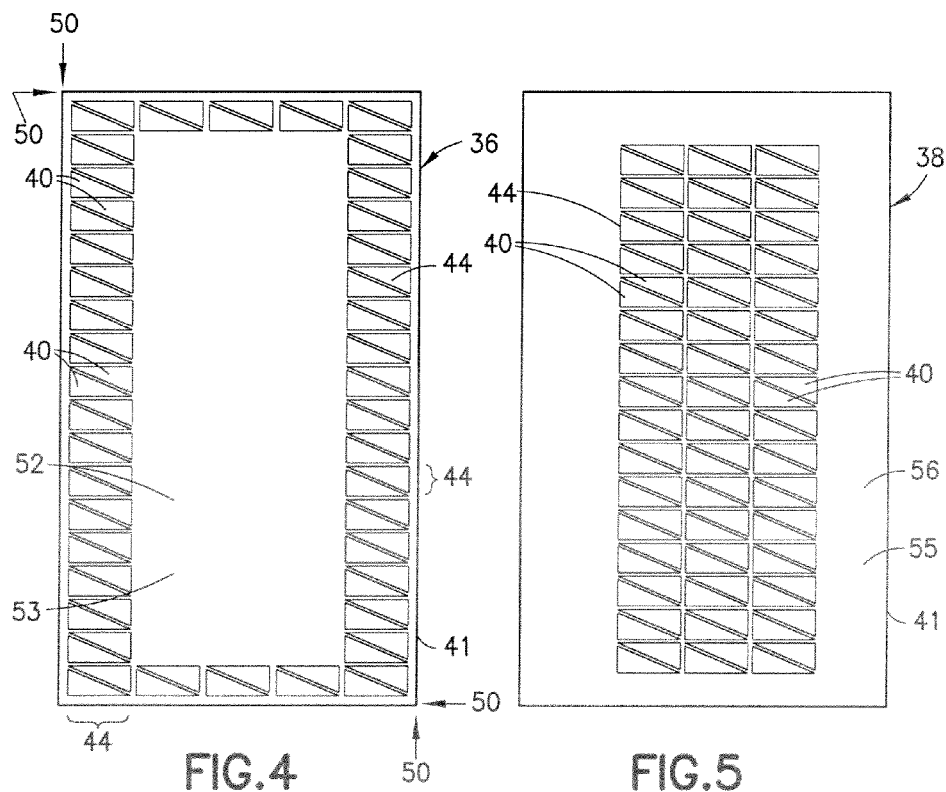
FIG. 4 is a top view of the first layer of the touch input device shown in FIG. 3.
FIG. 5 is a top view of the second layer of the touch input device shown in FIG. 3.
Figure 6:
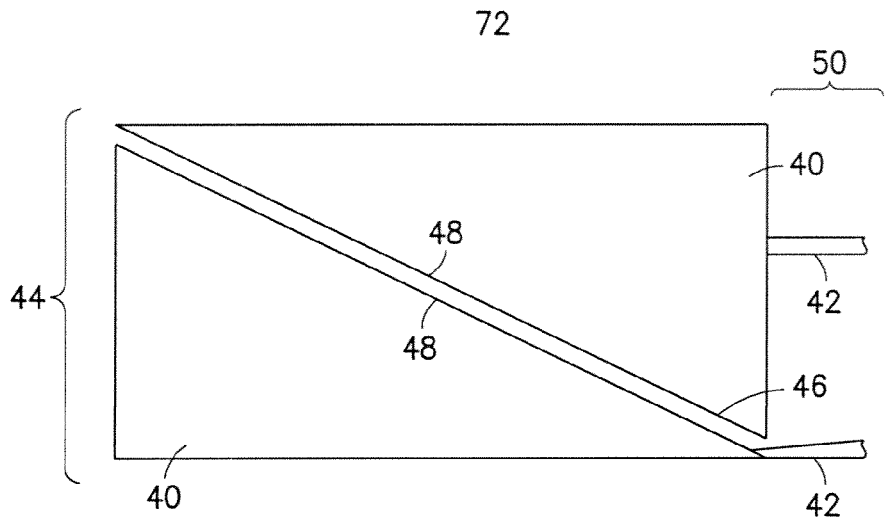
FIG. 6 is an enlarged view of one of the pairs of capacitive sensors and their leads shown in FIGS. 4 and 5.

FIG. 4 is a top view of the first layer 36, but showing the location of the substantially transparent capacitive sensors 40 on that layer. FIG. 5 is a top view of the second layer 38, but showing the location of the substantially transparent capacitive sensors 40 on that layer. Referring also to FIG. 6, in this embodiment the first and second layers 36, 38 each comprise a substrate 41 (see FIGS. 4 and 5), the capacitive sensors or electrodes 40 on the substrate, and traces or electrical conductors 42 on the substrate which are configured to function as leads or routing from the sensors 40. In the example shown, the capacitive sensors 40 each have a substantially triangular shape. One or more electrodes with a different shape may be provided. Pairs 44 of the capacitive sensors 40 are arranged or located relative to each other as substantial mirror images with a small gap 46 therebetween. Each pair 44 of the triangular shaped capacitive sensors are arranged relative to each other to form a substantially rectangular shape as illustrated best in FIG. 6.

Figure 7A:
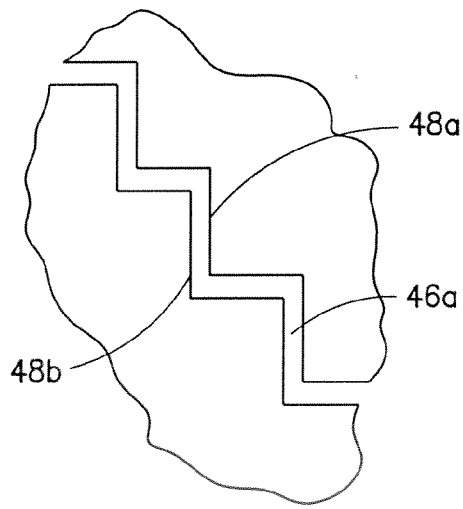
FIG. 7A is a partial enlarged view of an alternate gap between capacitive sensors in a pair.
Figure 7B:
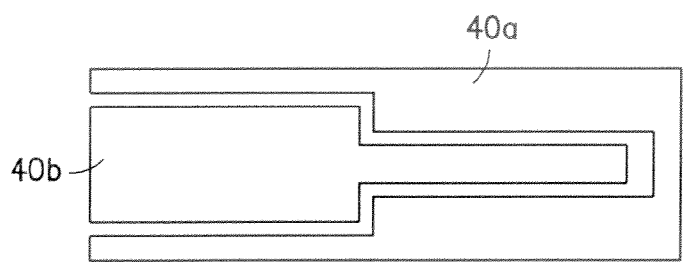
FIG. 7B is a view illustrating an alternate shape of a pair of capacitive sensors.

In FIG. 6 the opposing long edges 48 of the triangles are shown substantially straight. However, as illustrated by FIG. 7A, the edges 48a, 48b might not be straight. FIG. 7A shows edges 48a, 48b which are stepped with a non-straight gap 46a therebetween. FIG. 7B shows another example where the pair of capacitive sensors 40a, 40b are not triangular shaped. The pair of the capacitive sensors are arranged intermixed with each other with a small gap therebetween to form a substantially rectangular shape; where each of the individual capacitive sensors 40a, 40b of the pair does not have a substantially square or rectangular shape.

Figure 8:
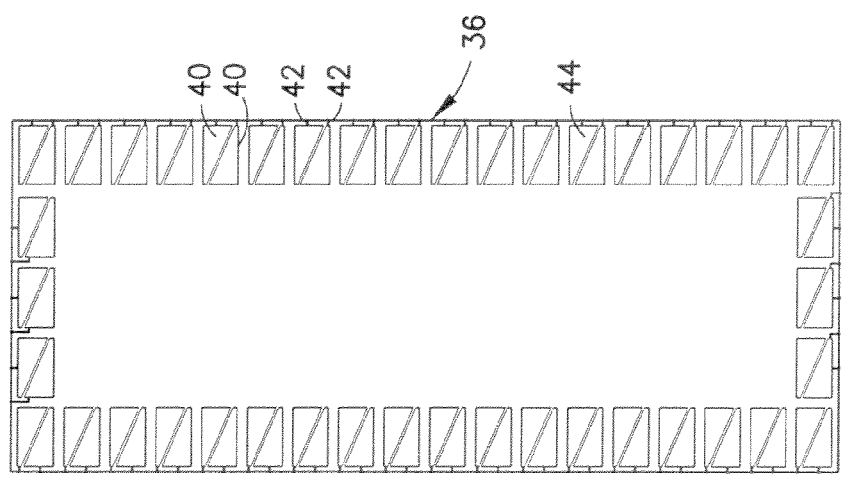
FIG. 8 is a top view of the first layer shown in FIG. 4 showing the routing/leads.

As seen in FIG. 4, the pairs 44 of capacitive sensors 40 of the first layer 36 are arranged in a substantially ring shaped pattern. The top layer 36 has its capacitive sensors arranged with one column of capacitive sensors on the left hand side, one column on the right hand side, and one row of capacitive sensors on each of the top side and the bottom side. Referring also to FIG. 8, the electrical conductors or leads 42 extend from the same side of each pair towards a nearby side of the substrate 41. The area 50 (see FIGS. 4 and 6) along the outside perimeter of the top layer 36, which includes the leads 42 and a small portion of the sensors 40 at the leads, is outside the active area of the touch input device 32, such as covered by a portion of the housing 12 for example. The area 52, as seen in FIG. 4, inside the inner perimeter of the substantially ring-shaped first capacitive sensors 40 of the first layer 36 forms a window area for the second capacitive sensors 40 on the second layer 38. In one type of example embodiment the first layer 36 comprises a transparent electrically conductive material 53, such as ITO for example, at the window area 52. The transparent electrically conductive material 53 at the window area 52 may be used to function as a top guard for the second capacitive sensors 40 on the second layer 38.

As seen in FIG. 5, the pairs 44 of second capacitive sensors 40 of the second layer 38 are arranged in a substantially block shaped pattern in rows and columns. In this example the block of second capacitive sensors comprise three columns of pairs 44. The capacitive sensors in the second layer are arranged in a pattern sized to fit under the first layer within an inside perimeter of the substantially ring-shaped pattern of the first capacitive sensors in the first layer. In other words, the pattern of the second capacitive sensors 40 of the second layer 38 fits under the window area 52 of the first layer 36.

Figure 9:
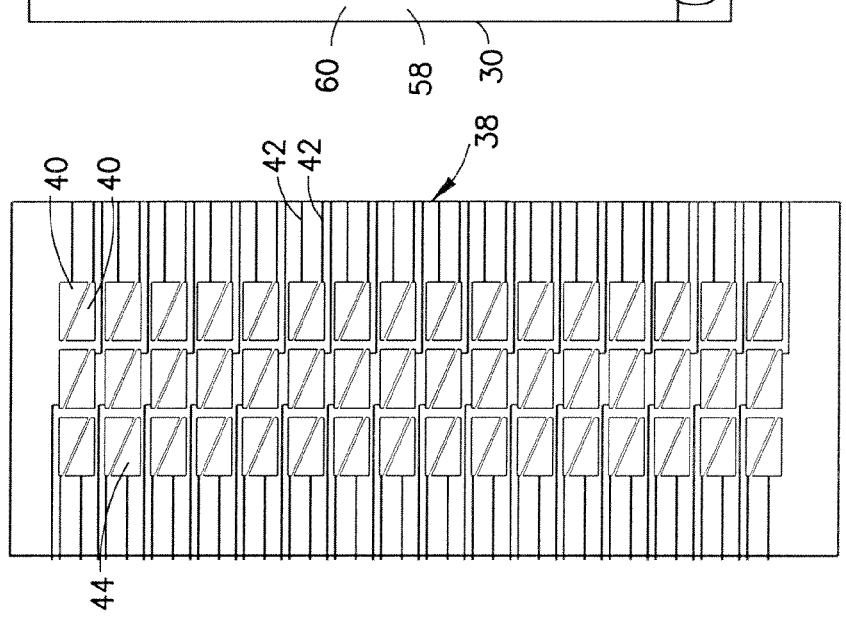
FIG. 9 as a top view of the second layer shown in FIG. 5 showing the routing/leads.

Referring also to FIG. 9, the electrical conductors or leads 42 of the second layer 38 extend from the same side of each pair on the left and right columns towards a nearby side of the substrate 41. The electrical conductors or leads 42 in the center column extend from opposite sides of each pair towards a nearby side of the substrate 41. The top side of the substrate 41 of the second layer 38 may comprise electrically conductive material 56, such as ITO for example, having a same size and shape as the ring-shaped capacitive sensors 40 on the first layer to thereby provide an active bottom guard for the first capacitive sensors on the first layer 36.

Figure 10:
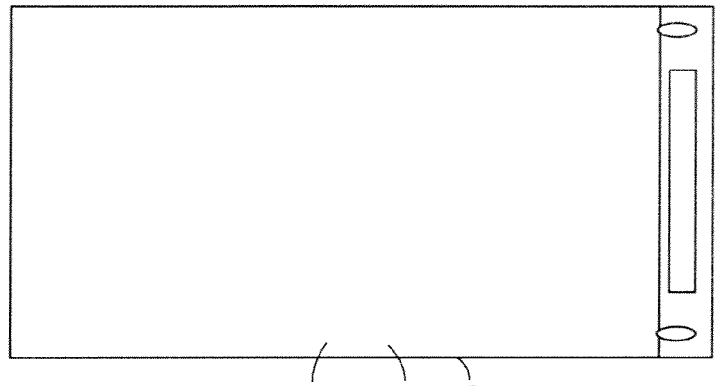
FIG. 10 is a top view of the display shown in FIG. 3.

Referring also to FIGS. 3 and 10, the electrical display 30 comprises a top layer 58, such as glass for example, which comprises electrically conductive material 60, such as ITO for example. Display suppliers/manufacturers use ITO for Electrostatic Discharge (ESD) protection and to keep the reference voltage constant to avoid any optical issues if when pressing the display. Since the second layer 38 has the capacitive sensors within the display area of the display 30 (not extending past the edges of the display 30), one can use the display 30 to provide the bottom guard layer function for the second layer 38.

Features as described herein may be used to create a pattern for a touch sensor, such as a 3-D touch sensor for example, by changing the capacitive sensor shape. This may make the touch sensor more compact and more cost effective, and provide more efficient use of each layer. This may be used to decrease the number of routing/leads on the top layer of a touch sensor so that one does not need a top guard (provided as an electrically conductive material) on the viewable area above the first layer having capacitive sensors. In other words, the cover window 34 does not need ITO, because the cove window does not need to provide an electrical guard feature for the leads 42 on top layer 36. That allows one to use normal non-ITO glass as the cover window (which makes it easier to make 2.5-D shape windows and/or use a GORILLA glass window). Also, features as described herein may used to reduce the number of substrates/layers with conductive material, and make the touch sensor thinner.

Features as described herein may be provided in a sensor pattern that has two layers. The top capacitive sensor layer may be designed to have little to no routings/leads in the viewable area; resulting in no need for a guard layer above those leads. This may be done by changing the shape of the capacitive sensors from a typical square shape to a right triangle shape. The bottom capacitor sensor layer may take up a small enough space that it can be guarded by ITO of the display 30 that is already present in the display.

One type of conventional 3-D capacitive touch sensor has four layers of substrates; all with conductive material. The first layer is a guard with electrically conductive material. The second layer has capacitive sensors. The third layer has capacitive sensors. The fourth layer is a bottom guard with electrically conductive material.

With features as described herein, because the top capacitor sensor layer has no routings/leads at the decorative window area 52 and the leads 42 are only in the non-active areas 50, there is no need for a top guard layer for the top layer 36 to have electrically conductive material. With features as described herein, conductive material 53 may be placed directly on the decoration area 52 of the top capacitive sensor layer 36 to function as a top guard for the second layer 38. Placing conductive material 53 directly on the window area 52 is inexpensive and adds very little thickness. The capacitive sensors on the bottom capacitive sensor layer 38 take up less area; not occupying perimeter area 55. Therefore, the bottom capacitor sensor layer 38 may be guarded by the display 30 without a need for a fourth layer having electrically conductive material as described above for a conventional 4-layer type of capacitive touch sensor.

A conventional 3-D structure has a guard layer on top comprising ITO, capacitor sensors (two layers of sensors), and a guard layer on bottom comprising ITO. Conventional capacitor sensors use a square shape for sensing. Underneath each conductive sensor, there needs to be an active guard layer. There needs to be a top guard for long routings going from the capacitive sensor to the A/D chip to protect from false detects. Features as described herein may be used to avoid using ITO on the in the cover window while also eliminating the bottom guard layer by instead using a portion of the electrical display 30 to provide the bottom guard feature.

With features as described herein, one may change the capacitive sensor pattern to allow routing/leads in the top layer 36 to an area only outside the active area. One may do this by changing the sensor shape while still keeping the same number of sensors as a conventional touch input device. A top layer having capacitive sensors may have all the outside sensors, such as eighty-four sensors on the outside for example. A bottom layer having capacitive sensors may have the inside capacitive sensors which need routing to the outside edges of the substrate. The routing from the capacitive sensors on the bottom layer may be less visible since it is on the bottom layer; underneath the capacitive sensors of the top layer. The bottom layer of capacitive sensors may have 96 capacitive sensors for example.

The window area 52 inside the inner perimeter of the top layer of capacitive sensors may be fill with ITO for guarding the capacitive sensors on the bottom layer of capacitive sensors. Using a right angle triangle shape as the shape of the capacitive sensors, one is able to have no rousing on the top layer chat is in the active area. This allows one to use more area of the active region of the top layer as a sensor (making the area of the pairs 44 larger than conventional square sensors) due to less routing around other sensors. On the top layer, tips on the triangles may be just outside the viewable area of the sensor. For the top layer 36, there is no need to route around other capacitive sensors.

With features as described herein, an only-2-layer PET (Polyethylene Terephthalate—Plastic substrate) substrate solution, without ITO on a Window, may be provided. With features as described herein, the traces/leads on the top layer of capacitive sensors are all outside the viewable area and, therefore, no electrical guard feature need be provide by the cover window on top of the top layer. All capacitive sensors will not need to be routed around other sensor to leave the leave the active area. This allows one to not need any electrical guarding of the viewable area on top of the top or first layer having capacitive sensors to prevent false detects. Since there is less routing on the top layer having capacitive sensors, the capacitive sensors on the top layer may be bigger than in convention designs, and act as a better guard over the routing on the bottom layer having capacitive sensors.

The area which the capacitive sensors occupy on the bottom layer 38 may now cover a much smaller X and Y area than in a conventional capacitive sensor bottom layer. The bottom layer may provide the inner capacitive sensors. Due to the area being smaller than a conventional bottom layer having capacitive sensors, it is possible to use a smaller electrical bottom guard for this layer than it would be for the whole TID active area. The design of routings provided from the capacitive sensor on the bottom layer may be very flexible due to several points of exit to the decorated area. The top side of the bottom layer may comprise ITO to function as an active bottom guard for the top capacitive sensors.

Providing ITO on a cover window has a lot of manufacturing issues and limitations. It is also difficult to get GORILLA glass treatment on a cover window with ITO. It is difficult to get 2.5-D shapes on glass cover windows with ITO on them. All of this leads to low yields and higher costs. Features as described herein may be used to create a compact solution while decreasing cost of the already provided solutions for 3-D sensors. A new sensor pattern may be used to take advantage of allocation of each layer 36, 38 and the top substrate 58 of the display 30. With triangle shape capacitive sensors, one can have a top layer that can quickly go outside the viewable area to the decorative area. The first layer sensor pattern may be provided with no traces in the visible area, which means one does not need to apply ITO to the cover window or add an extra PET layer having ITO above the top layer 36.

With features as described herein, the second layer capacitive sensor pattern as seen in FIG. 5 is small enough to be in the display glass area. This allows the routing 42 of the second layer 38 to be guarded by the sensors 40 on the first layer. In other words, the majority of the length of the leads 42 of the second layer 38 are covered by the sensors 40 on the top layer 36. This also allows one to use the display 30 to provide the bottom electrical guard feature for the second layer 38 rather than adding an additional layer below the second layer 38.

It is important that traces 42, which are used between a touch controller and sensors 40 of the 3-D touch panel, are short because a capacitance of the traces cannot be too high. Sensors of the 3-D capacitive touch may be implemented in a shape of triangles. A conductive material 53 may be used on the decoration area 52. Advantages include minimized routing because of the triangle shape sensors in the viewable area such that a top guard layer is not needed there. A separate top guard layer above the first layer 36, for the second layer 38, is not needed if a conductive material 52 is used on the decoration area 52. A novel feature includes a conductive material 53 being used on the decoration area 52 such that an additional top guard is not needed. A top guard layer is not needed above the first layer 36 for the first layer 36 because a length and number of the traces (routings) 42 of the first layer 36 are minimized in the viewable area of the first layer 36.

Features as described herein may be used in a design for an advanced 3-D touch sensor. The pattern may have only two layers of substrate 41. The top layer 36 may be designed to have very little to no routing in the visible area of the sensor in order to prevent putting another conductive layer above it to guard against false detects. It does this by not using the common square shape of the capacitive sensor and instead using the right angle triangles. The bottom layer was designed so that it is guarded by the conductive area having material 60 on 58 of the display 30. This reduces the original idea of having 3 to 4 separate substrates for the touch sensor to only 2 substrates. This 2-layer design provides a thinner and more cost effective solution for the 3-D sensor.

Existing conventional designs require either 3 to 4 layer of external substrates (either glass or PET) for ITO to be layered on top of each other. Features as described herein are able to reduce that to two layers while avoiding having to place ITO on the glass cover window (which is another solution from previous designs). Having ITO on glass cover window makes it difficult to manufacture 2.5-D glass and GORILLA glass. That is why it is avoided (adds to much cost and yield problems). Features as described herein may provide a thinner and less expensive design, which is also more visually appealing.

An example embodiment may comprise an apparatus including capacitive sensors 40, where the capacitive sensors are arrange in a first layer 36 and a second layer 38, where the first layer is located on top of the second layer; and a cover window on top of the first layer, where the cover window does not comprise electrically conductive material.

At least some of the capacitive sensors may comprise a substantially triangular shape. The capacitive sensors may comprise a pair of the triangular shaped capacitive sensors arranged relative to each other to form a substantially square or rectangular shape. The pair of triangular shaped capacitive sensors may each have an electrical conductor, parallel to each other, extending from each of the pair of triangular shaped capacitive sensors towards a same side of the first layer. The capacitive sensors in the first layer may be arranged in a substantially ring-shaped pattern. The capacitive sensors in the second layer may be arranged in a pattern sized to fit under the first layer within an inside perimeter of the substantially ring-shaped pattern of the capacitive sensors in the first layer. Electrical conductors from the capacitive sensors in the second layer may all extend under the capacitive sensors of the first layer. The apparatus may further comprise an electrical display, where the electrical display comprises a top layer comprising electrically conductive material located directly against a bottom side of the second layer of capacitive sensors. A pair of the capacitive sensors may be arranged directly laterally opposite each other with a small gap therebetween to form a substantially square or rectangular shape, where each of the individual capacitive sensors of the pair does not have a substantially square or rectangular shape. The apparatus may further comprise means for providing a capacitive touch sensor for use with an electrical display, where the capacitive touch sensor has the guard layer as a top guard layer on the first layer, and the capacitive touch sensor does not comprise a bottom guard layer having electrically conductive material. The apparatus may be provided in a hand-held portable electronic device comprising a housing; electronic circuitry connected to the housing, where the electronic circuitry comprises an electrical display; and the apparatus connected to the electronic circuitry, where the apparatus is located on top of the electrical display.

An example embodiment may comprise an apparatus including a first layer comprising first capacitive sensors; and a second layer comprising second capacitive sensors. The first layer is located on top of the second layer, where the first capacitive sensors are arranged in a substantially ring-shaped pattern, and where the second capacitive sensors are arranged in a pattern sized to fit under the first layer within an inside perimeter of the substantially ring-shaped pattern of the first capacitive sensors.

The apparatus further comprises a guard layer forming a window on top of the first layer, where the guard layer does not comprise electrically conductive material. At least some of the capacitive sensors may comprise a substantially triangular shape, where the capacitive sensors comprise a pair of the triangular shaped capacitive sensors arranged relative to each other to form a substantially square or rectangular shape. The pair of triangular shaped capacitive sensors may each have an electrical conductor, parallel to each other, extending from each of the pair of triangular shaped capacitive sensors towards a same side of the first layer. Electrical conductors from the second capacitive sensors in the second layer may all extend under at least some of the first capacitive sensors of the first layer. The apparatus may further comprise an electrical display, where the electrical display comprises a top layer comprising electrically conductive material, where the top layer of the electrical display is located directly against a bottom side of the second layer.

An example method may comprise providing a first layer comprising first capacitive sensors arranged in a substantially ring-shaped pattern and first electrical conductors extending from the first capacitive sensors towards outer edges of the first layer; providing a second layer comprising second capacitive sensors and second electrical conductors extending from the second capacitive sensors towards outer edges of the second layer, where the second capacitive sensors are arranged in a pattern having a size about a same size as an inner perimeter of the substantially ring-shaped pattern; and locating the first layer on top of the second layer, where the second electrical conductors are located at least partially under the first capacitive sensors.

The method may further comprise locating a guard layer on top of the first layer, where the guard layer forms a window, and where the guard layer does not comprise electrically conductive material. The method may further comprise locating a bottom side of the second layer directly against a top layer of an electrical display, where top layer of the electrical display comprises electrically conductive material.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
    capacitive sensors located in a viewable area of the apparatus, where the capacitive sensors are arrange in a first layer and a second layer, where the first layer is located on top of the second layer, where the capacitive sensors in the first layer are arranged in a substantially ring-shaped pattern, where the capacitive sensors in the first layer comprise a plurality of pairs of the capacitive sensors, where both capacitive sensors of each pair are aligned with other ones of the pairs in a common column or row, and where both capacitive sensors of each pair has an end which is outside the viewable area such that no leads from the capacitive sensors of each pair are in the viewable area; and a cover window on top of the first layer, where the cover window does not comprise electrically conductive material.

2. An apparatus as in claim 1 where at least some of the capacitive sensors comprise a substantially triangular shape.

3. An apparatus as in claim 2 where the capacitive sensors comprise a pair of the triangular shaped capacitive sensors arranged relative to each other to form a substantially square or rectangular shape.

4. An apparatus as in claim 3 where the pair of triangular shaped capacitive sensors each have an electrical conductor, parallel to each other, extending from each of the pair of triangular shaped capacitive sensors towards a same side of the first layer.

5. An apparatus as in claim 1 where the capacitive sensors in the second layer are arranged in a pattern sized to fit under the first layer within an inside perimeter of the substantially ring-shaped pattern of the capacitive sensors in the first layer.

6. An apparatus as in claim 1 where electrical conductors from the capacitive sensors in the second layer all extend under the capacitive sensors of the first layer.

7. An apparatus as in claim 1 further comprising an electrical display, where the electrical display comprises a top layer comprising electrically conductive material located directly against a bottom side of the second layer of capacitive sensors.

8. An apparatus as in claim 1 where each of the capacitive sensors of each pair in the first layer are arranged directly laterally opposite each other with a small gap therebetween to form a substantially square or rectangular shape, where each of the individual capacitive sensors of the pair does not have a substantially square or rectangular shape.

9. An apparatus as in claim 1 further comprising means for providing a capacitive touch sensor for use with an electrical display, where the capacitive touch sensor does not comprise a bottom guard layer having electrically conductive material.

10. A hand-held portable electronic device comprising:
a housing;
electronic circuitry connected to the housing, where the electronic circuitry comprises an electrical display; and
an apparatus as in claim 1 connected to the electronic circuitry, where the apparatus is located on top of the electrical display.

11. An apparatus comprising:
a first layer comprising first capacitive sensors located in a viewable area of the apparatus, where the capacitive sensors in the first layer comprise a plurality of pairs of the capacitive sensors, where both capacitive sensors of each air are aligned with other ones of the pairs in a common column or common row, and where both capacitive sensors of each pair has an end which is outside the viewable area such that no leads from the capacitive sensors of each pair are in the viewable area; and
a second layer comprising second capacitive sensors located in the viewable area of the apparatus,
where the first layer is located on top of the second layer, where the first capacitive sensors are arranged in a substantially ring-shaped pattern, and where the second capacitive sensors are arranged in a pattern sized to fit under the first layer within an inside perimeter of the substantially ring-shaped pattern of the first capacitive sensors.

12. An apparatus as in claim 11 further comprising a cover window on top of the first layer, where the cover window does not comprise electrically conductive material.

13. An apparatus as in claim 11 where at least some of the capacitive sensors comprise a substantially triangular shape, where the capacitive sensors of each pair are triangular shaped capacitive sensors arranged relative to each other to form a substantially square or rectangular shape.

14. An apparatus as in claim 13 where the pair of triangular shaped capacitive sensors each have an electrical conductor forming their respective leads, parallel to each other, extending from each of the pair of triangular shaped capacitive sensors towards a same respective side of the first layer.

15. An apparatus as in claim 11 where electrical conductors from the second capacitive sensors in the second layer all extend under at least some of the first capacitive sensors of the first layer.

16. An apparatus as in claim 11 further comprising an electrical display, where the electrical display comprises a top layer comprising electrically conductive material, where the top layer of the electrical display is located directly against a bottom side of the second layer.

17. A method comprising:
providing a first layer comprising first capacitive sensors, located in a viewable area of an apparatus, arranged in a substantially ring-shaped pattern and first electrical conductors forming leads extending from the first capacitive sensors towards outer edges of the first layer, where the capacitive sensors in the first layer comprise a plurality of pairs of the capacitive sensors, where both capacitive sensors of each pair are aligned with other ones of the pairs in a common column or row, and where both capacitive sensors of each pair has an end which is outside the viewable area such that the leads from the capacitive sensors of each pair are not in the viewable area;
providing a second layer comprising second capacitive sensors and second electrical conductors extending from the second capacitive sensors towards outer edges of the second layer, where the second capacitive sensors are arranged in a pattern having a substantially same size as an inner perimeter of the substantially ring-shaped pattern; and
locating the first layer on top of the second layer, where the second electrical conductors are located at least partially under the first capacitive sensors.

18. A method as in claim 17 further comprising locating a cover window on top of the first layer, where the cover window does not comprise electrically conductive material.

19. A method as in claim 17 further comprising locating a bottom side of the second layer directly against a top layer of an electrical display, where top layer of the electrical display comprises electrically conductive material.

* * * * *